US012550580B2

(12) United States Patent
Sakamoto

(10) Patent No.: US 12,550,580 B2
(45) Date of Patent: Feb. 10, 2026

(54) DISPLAY DEVICE

(71) Applicant: Magnolia White Corporation, Tokyo (JP)

(72) Inventor: Asami Sakamoto, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 363 days.

(21) Appl. No.: 18/361,922

(22) Filed: Jul. 31, 2023

(65) Prior Publication Data

US 2024/0040888 A1 Feb. 1, 2024

(30) Foreign Application Priority Data

Aug. 1, 2022 (JP) ................. 2022-122529

(51) Int. Cl.
 *H10K 59/38* (2023.01)
(52) U.S. Cl.
 CPC .................... *H10K 59/38* (2023.02)
(58) Field of Classification Search
 CPC .. H10K 59/38; H10K 59/1201; H10K 59/353; H10K 59/32
 See application file for complete search history.

(56) References Cited

U.S. PATENT DOCUMENTS

| 8,269,227 B2 * | 9/2012 | Yamazaki ............. H10K 50/10 313/506 |
| 2007/0008257 A1 * | 1/2007 | Seo ..................... H10K 59/351 345/83 |
| 2022/0149127 A1 | 5/2022 | Ogawa et al. |

FOREIGN PATENT DOCUMENTS

JP 2021-026844 A 2/2021

* cited by examiner

*Primary Examiner* — Kevin Quarterman
(74) *Attorney, Agent, or Firm* — XSENSUS LLP

(57) ABSTRACT

According to one embodiment, a display device includes a first light emitting layer provided in center in plan view, a first metal oxide layer provided on the first light emitting layer, a ring-shaped second light emitting layer provided to surround the first light emitting layer, a second metal oxide layer provided on the second light emitting layer, a ring-shaped third light emitting layer provided to surround the second light emitting layer, a third metal oxide layer provided on the third light emitting layer, and an organic insulating layer which covers the first emitting layer, the second emitting layer, the third emitting layer, the first metal oxide layer, the second metal oxide layer, and the third metal oxide layer.

10 Claims, 15 Drawing Sheets

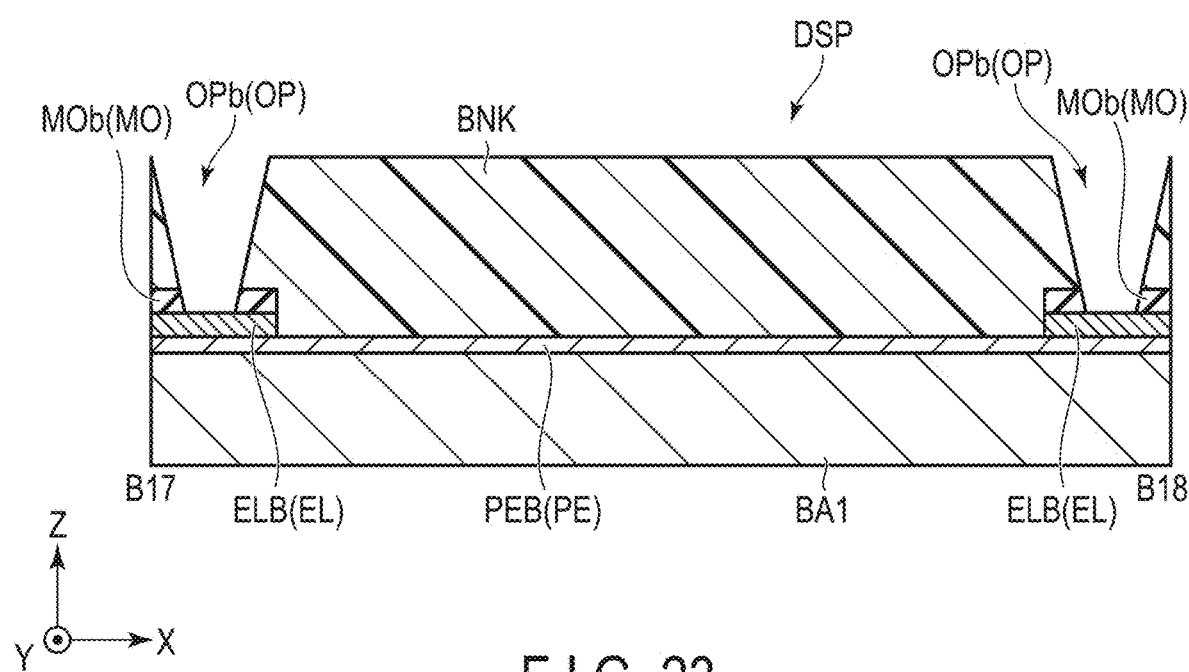
F I G. 23

DISPLAY DEVICE

CROSS-REFERENCE TO RELATED APPLICATIONS

This application is based upon and claims the benefit of priority from Japanese Patent Application No. 2022-122529 filed Aug. 1, 2022, the entire contents of which are incorporated herein by reference.

FIELD

Embodiments described herein relate generally to an electronic device.

BACKGROUND

Display devices including a light emitting layer containing an organic electroluminescent (EL) material have been developed. In such display devices, pixels emitting different colors are provided next to each other. The pixels are respectively provided with light emitting layers that emit different colors.

BRIEF DESCRIPTION OF THE DRAWINGS

FIG. 23 is a diagram illustrating the method of manufacturing the display device of the embodiment.

DETAILED DESCRIPTION

Figure 1:
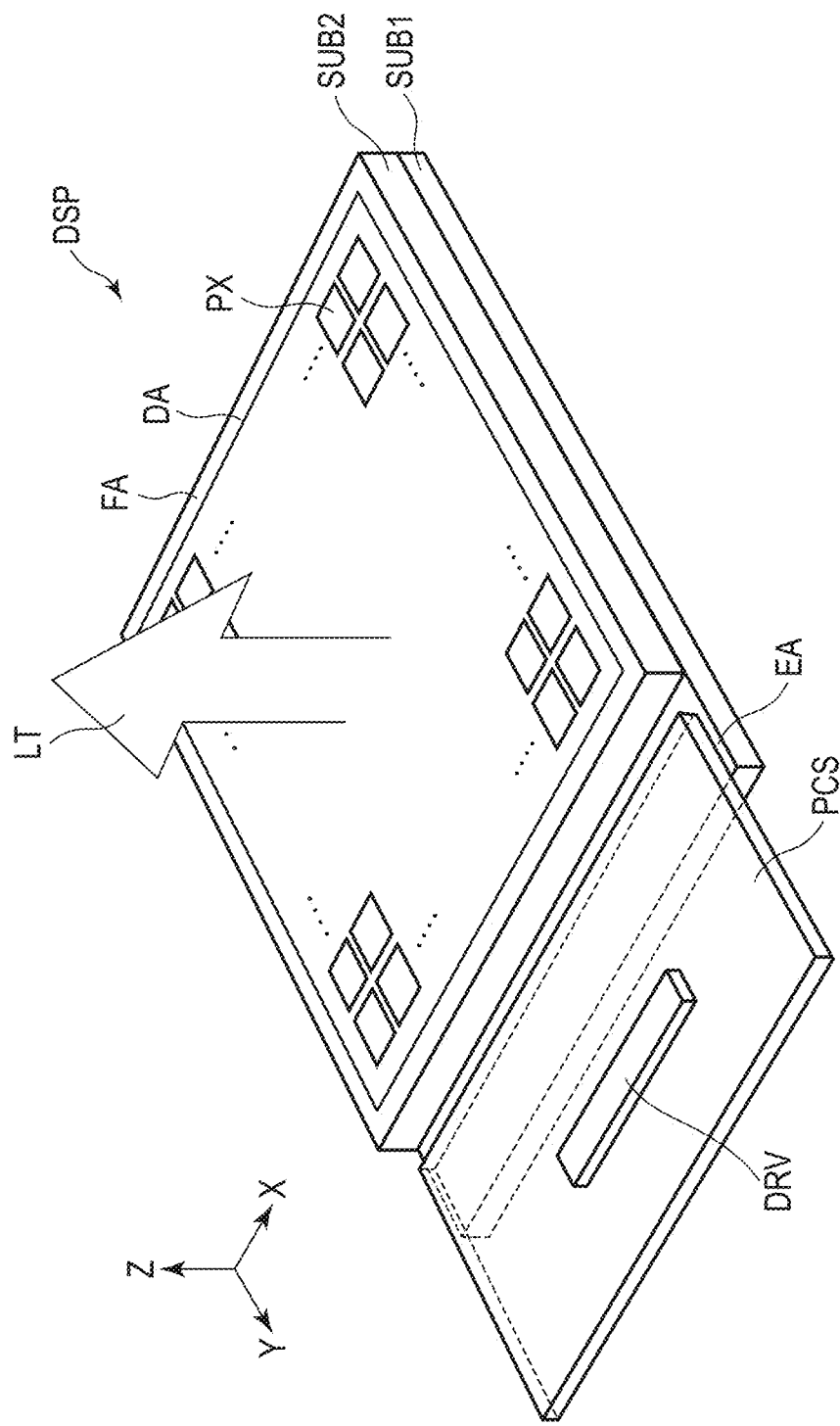
FIG. 1 is an overall perspective view of a display device of an embodiment.

In general, according to one embodiment, a display device comprises a first light emitting layer provided in center in plan view;
a first metal oxide layer provided on the first light emitting layer;
a ring-shaped second light emitting layer provided to surround the first light emitting layer;
a second metal oxide layer provided on the second light emitting layer;
a ring-shaped third light emitting layer provided to surround the second light emitting layer;
a third metal oxide layer provided on the third light emitting layer;
an organic insulating layer which covers the first emitting layer, the second emitting layer, the third emitting layer, the first metal oxide layer, the second metal oxide layer, and the third metal oxide layer;
a first opening formed in the first metal oxide layer and the organic insulating layer, to reach the first light emitting layer;
a second opening formed in the second metal oxide layer and the organic insulating layer, to reach the second light emitting layer; and
a third opening formed in the third metal oxide layer and the organic insulating layer, to reach the third light emitting layer.

According to another embodiment, a display device comprises
a first light emitting layer and a second light emitting layer provided adjacent to each other in plan view;
a first metal oxide layer provided on the first light emitting layer;
a second metal oxide layer provided on the second light emitting layer;
a ring-shaped third light emitting layer provided to surround the first light emitting layer and the second light emitting layer;
a third metal oxide layer provided on the third light emitting layer;
an organic insulating layer which covers the first light emitting layer, the second light emitting layer, the third light emitting layer, the first metal oxide layer, the second metal oxide layer and the third metal oxide layer;
a first opening formed in the first metal oxide layer and the organic insulating layer, to reach the first light emitting layer;
a second opening formed in the second metal oxide layer and the organic insulating layer, to reach the second light emitting layer; and
a third opening formed in the third metal oxide layer and the organic insulating layer, to reach the third light emitting layer.

An object of the present embodiment is to provide a display device which can expand the flexibility of pixel design.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

The embodiments described herein are not general ones, but rather embodiments that illustrate the same or corresponding special technical features of the invention. The following is a detailed description of one embodiment of a display device with reference to the drawings.

In this embodiment, a first direction X, a second direction Y and a third direction Z are orthogonal to each other, but may intersect at an angle other than 90 degrees. The direction toward the tip of the arrow in the third direction Z is defined as up or above, and the direction opposite to the direction toward the tip of the arrow in the third direction Z is defined as down or below. Note that the first direction X, the second direction Y and the third direction Z may as well be referred to as an X direction, a Y direction and a Z direction, respectively.

With such expressions as "the second member above the first member" and "the second member below the first member", the second member may be in contact with the first member or may be located away from the first member. In the latter case, a third member may be interposed between the first member and the second member. On the other hand, with such expressions as "the second member on the first member" and "the second member beneath the first member", the second member is in contact with the first member.

Further, it is assumed that there is an observation position to observe the display device on a tip side of the arrow in the third direction Z. Here, viewing from this observation position toward the X-Y plane defined by the first direction X and the second direction Y is referred to as plan view. Viewing a cross-section of the display device in the X-Z plane defined by the first direction X and the third direction Z or in the Y-Z plane defined by the second direction Y and the third direction Z is referred to as cross-sectional view.

EMBODIMENTS

FIG. 1 is an overall perspective view of a display device of an embodiment. A display device DSP comprises a display area DA and a peripheral area FA provided around the display area DA on a substrate SUB1. The display device DSP comprises a plurality of pixels PX arranged in the display area DA. In the display device DSP, light LT from a rear surface is transmitted to a front surface and vice versa.

On an upper surface of the display area DA, a substrate SUB2 is provided as a sealing member. The substrate SUB2 is fixed to the substrate SUB1 by a sealing material (not shown) provided to surround the display area DA. The display area DA formed on the substrate SUB1 is sealed by the substrate SUB2 as a sealing member and the sealing material so as not to be exposed to the atmosphere.

An area EA at an end portion of the substrate SUB1 is located an outer side of the substrate SUB2. On the area EA, a wiring board PCS is provided. The wiring board PCS is provided with a drive element DRV that outputs video signals and drive signals. The signals from the drive element DRV are input to the pixels PX in the display area DA via the wiring board PCS. Based on the video signals and various control signals, the pixels PX emits light, respectively.

Figure 2:
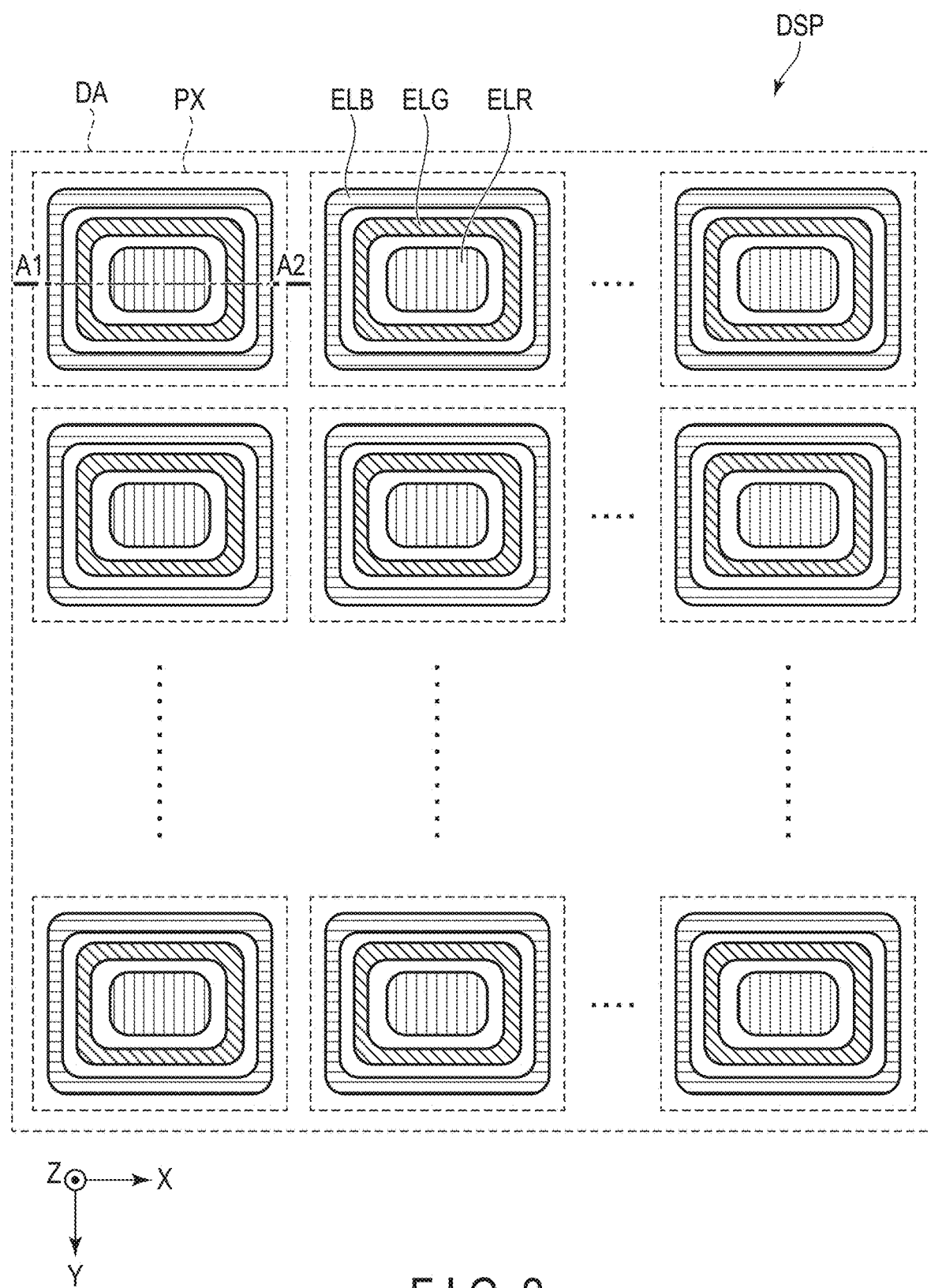
FIG. 2 is a plan view schematically showing a configuration example of the display device.

FIG. 2 is a plan view schematically showing a configuration example of the display device. As described above, a plurality of pixels PX are provided in the display area DA of the display device DSP. Each of the pixels PX includes a light emitting layer ELR that emits red (R) light, a light emitting layer ELG that emits green (G) light, and a light emitting layer ELB that emits blue (B) light. The light emitting layers ELR, ELG and ELB are arranged in concentric circles in this order, with the light emitting layer ELR at the center. In other words, the ring-shaped light emitting layer ELG is provided to surround the approximately elliptical or rectangular-shaped light emitting layer ELR. The ring-shaped light emitting layer ELB is provided to surround the light emitting layer ELG.

However, the arrangement order of the light emitting layer ELR, the light emitting layer ELG and the light emitting layer ELB in this embodiment is not limited to this. The central light emitting layer may as well be the light emitting layer ELG or the light emitting layer ELB. The outermost light emitting layer may as well be the light emitting layer ELR or the light emitting layer ELG. In this embodiment, a light emitting layer that emits a predetermined color is surrounded by light emitting layers that respectively emit colors different from the predetermined color. With this configuration, it is possible to obtain a display device DSP that can expand the flexibility of pixel design.

Figure 3:
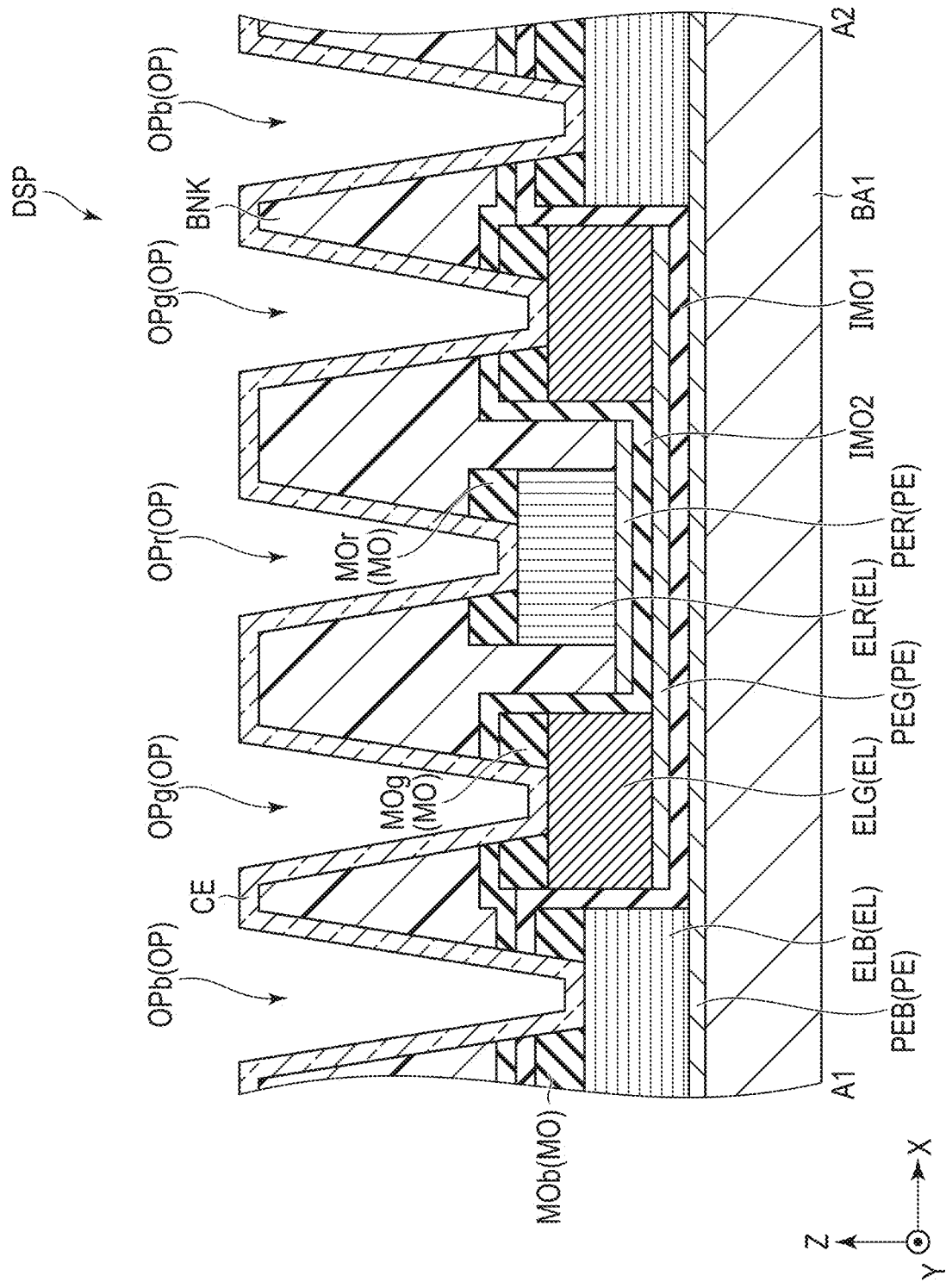
FIG. 3 is a cross-sectional view showing the configuration of the display device taken along line A1-A2 in FIG. 2.

FIG. 3 is a cross-sectional view showing the configuration of the display device taken along line A1-A2 in FIG. 2. In the display device DSP, an anode PEB, a light emitting layer ELB, a metal oxide layer MOb, a metal oxide layer IMO1, an anode PEG, a light emitting layer ELG, a metal oxide layer MOg, a metal oxide layer IMO2, an anode PER, a metal oxide layer MOr, and a bank (which may as well be referred to as a partition wall or rib) BNK are provided on a base BA1. Here, as mentioned above, the light emitting layer ELR, the light emitting layer ELG and the light emitting layer ELB may not be arranged in this order. The positions of the light emitting layer ELR, the light emitting layer ELG and the light emitting layer ELB can be interchanged in the cross-sectional structure as well.

The base BA1 can be, formed of, for example, glass or a resin material. Examples of the resin material are acrylic, polyimide, polyethylene terephthalate, polyethylene naphthalate and the like, and each may be formed into a single layer or a multilayer of a plurality of films of any of these.

The anode PEB, the anode PEG and the anode PER are formed in a three-layer stacked structure of indium zinc oxide (IZO), silver (Ag) and IZO, for example. In this embodiment, the anode PEB, the anode PEG and the anode PER may as well be referred to as pixel electrodes.

The metal oxide layer MOb, the metal oxide layer MOg, the metal oxide layer MOr, the metal oxide layer IMO1 and the metal oxide layer IMO2 contain at least one of titanium oxide ($TiO_2$), aluminum oxide ($AlO_x$), molybdenum oxide ($MoO_2$) and zinc oxide (ZnO). The metal oxide layer MOb, the metal oxide layer MOg, the metal oxide layer MOr, the metal oxide layer IMO1 and the metal oxide layer IMO2 may each be an oxide layer of one of the above-listed oxides or a mixed layer or stacked layer containing two or more oxides. With use of the metal oxide layers, different colored light emitting layers can be separated from each other to form light emitting layers independent from each other for respective different colors.

The bank BNK is formed of an organic insulating material. As the organic insulating material, for example, an organic material such as photosensitive acrylic, polyimide or the like can be listed.

The anode PEB is provided on the base BA1. Note that, between the base BA1 and the anode PEB, a thin-film transistor (TFT) that controls the drive of the light emitting layers, an electrode, a wiring line, an insulating layer and the like may as well be provided.

The light emitting layer ELB is provided on the anode PEB. In FIG. 3, two light emitting layers ELB are shown, but as shown in FIG. 2, the light emitting layers are formed to be integrated as a single unit.

On the light emitting layer ELB, the metal oxide layer MOb is provided.

The metal oxide layer IMO1 is provided to cover the anode PEB, the light emitting layer ELB and the metal oxide layer MOb.

On the metal oxide layer IMO1, between the two light emitting layers ELB, in FIG. 3, the anode PEG and the light emitting layer ELG are provided. The anode PEG and the light emitting layer ELG are stacked one on another in this order. In FIG. 3, two light emitting layers ELG are shown, but as shown in FIG. 2, the light emitting layers ELG are formed to be integrated as a single unit.

On the light emitting layer ELG, the metal oxide layer MOg is provided.

The metal oxide layer IMO2 is provided to cover the anode PEG, the light emitting layer ELG and the metal oxide layer MOg.

The anode PER and the light emitting layer ELR are provided on the metal oxide layer IMO2. The anode PER and the light emitting layer ELR are stacked one on another in this order. Along the first direction X, the light emitting layer ELG is provided between the light emitting layer ELR and the light emitting layer ELB.

On the light emitting layer ELR, the metal oxide layer MOr is provided.

This embodiment is described in connection with an example in which the light emitting layers EL (the light emitting layer ELR, the light emitting layer ELG and light emitting layer ELB) are provided between the anode PE and the cathode CE, which will be described later, but is not limited to this example. In addition to the light emitting layers EL, a hole injection layer, a hole transport layer, an electron blocking layer, a hole blocking layer, an electron transport layer, an electron injection layer and the like may be provided between the anode PE and the cathode CE. Further, in this embodiment, the anodes PE and the cathode CE may as well be referred to as pixel electrodes and a common electrode, respectively.

The bank BNK is provided to cover the anode PER, the light emitting layer ELR, and the metal oxide layer MOr.

The metal oxide layer MOb, the metal oxide layer IMO1, the metal oxide layer IMO2 and the bank BNK are provided with respective openings OPb that reach the light emitting layer ELB. The metal oxide layer MOg, the metal oxide layer IMO2 and the bank BNK are provided with respective openings OPg that reach the light emitting layer ELG. The metal oxide layer MOr and the bank BNK are provided with respective openings OPr that reach the light emitting layer ELR.

The cathode CE is provided to cover the bank BNK, the opening OPr, the opening CHg and the opening CHb, as well as the light emitting layer ELR, the light emitting layer ELG and the light emitting layer ELB. The cathode CE is in contact with each of the light emitting layer ELR, the light emitting layer ELG and the light emitting layer ELB. As the cathode CE, a magnesium-silver alloy (MgAg) film is formed to be such a thin film that through which the light emitted from the light emitting layers can be transmitted.

Although not shown in the figure, an insulating layer may as well be provided on the cathode CE to prevent moisture from entering the light emitting layer EL from the outside. As the insulating layer, a material with high gas barrier property is suitable. Further, another base of the same material as that of the base BA1 may be provided on the insulating layer as a protective material.

Note that in this embodiment, when the anode PER, anode PEG and anode PEB need not be particularly distinguished from each other, they are simply referred to the anodes (pixel electrodes) PE. When the light emitting layer ELR, the light emitting layer ELG and the light emitting layer ELB need not be particularly distinguished from each other, they are simply referred to as the light emitting layers EL. When the metal oxide layer MOr, the metal oxide layer MOg and the metal oxide layer MOb need not be particularly distinguished from each other, they are simply referred to as the metal oxide layers MO. When the opening OPr, the opening OPg and the opening OPb need not be particularly distinguished from each other, they are simply referred to as the openings OP.

Figure 4:
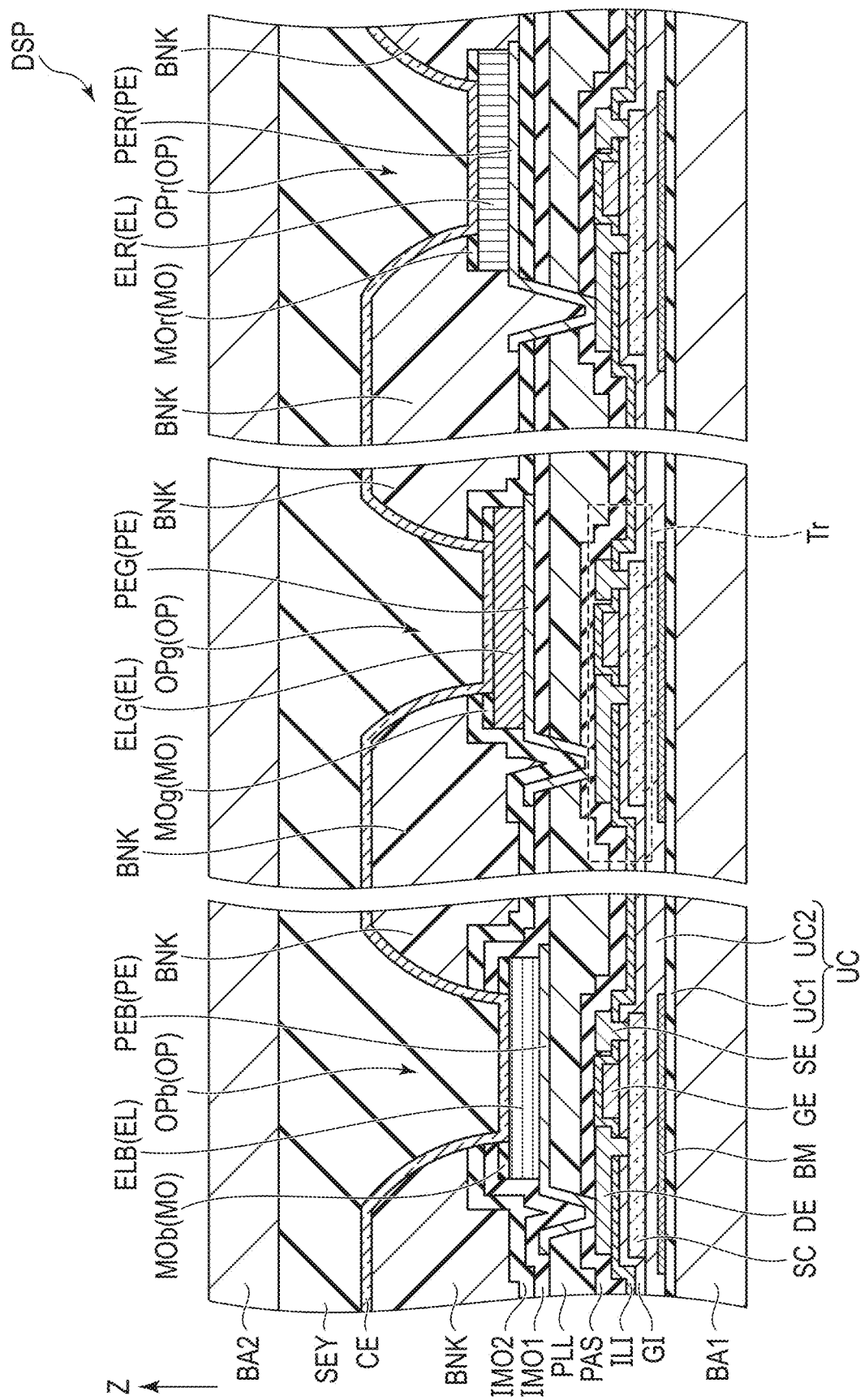
FIG. 4 is a cross-sectional view schematically showing a configuration example of the display device.
Figure 5:
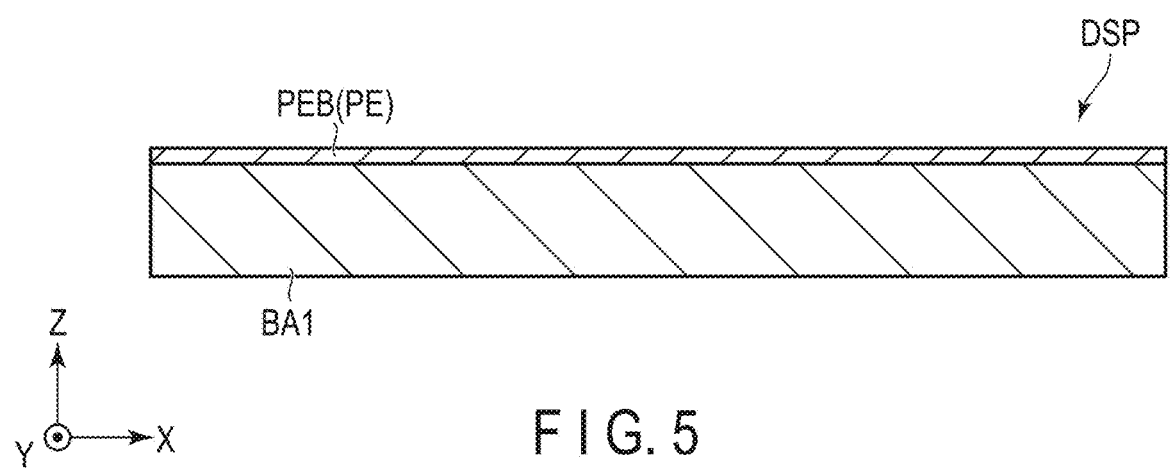
FIG. 5 is a diagram illustrating a method of manufacturing the display device of the embodiment.

FIG. 4 is a cross-sectional view schematically showing a configuration example of the display device of the embodiment. FIG. 4 shows a cross-sectional structure in more detail than that of FIG. 3.

In FIG. 4, an insulating layer UC1 is provided on the base BA1. The insulating layer UC1 is formed from, for example, a single layer of a silicon oxide film or a silicon nitride film or a stacked multilayer of these films.

A light-shielding layer BM may be provided on the insulating layer UC1 so as to overlap a transistor Tr, which will be described later. The light-shielding layer BM suppresses changes in transistor characteristics due to the entering of light, etc. from a rear surface of the channel of the transistor Tr. When the light-shielding layer BM is formed of a conductive layer, it is also possible to impart a back-gate effect to the transistor Tr by applying a predetermined potential thereto.

An insulating layer UC2 is provided to cover the insulating layer UC1 and the light-shielding layer BM. As the material for the insulating layer UC2, a material similar to that of the insulating layer UC1 can be used. Note that the insulating layer UC2 can be of a material different from that of the insulating layer UC1. For example, silicon oxide can be used for the insulating layer UC1 and silicon nitride can be used for the insulating layer UC2. The insulating layers UC1 and UC2 are altogether referred to as an insulating layers UC.

The transistor Tr is provided on the insulating layer UC. The transistor Tr includes a semiconductor layer SC, an insulating layer GI, a gate electrode GE (scanning line), an insulating layer ILI, a source electrode SE (signal line) and a drain electrode DE.

For the semiconductor layer SC, amorphous silicon, polysilicon or oxide semiconductor is used.

The insulating layer GI is provided, for example, as a single layer of silicon oxide or silicon nitride or as stacked layers of these.

As the gate electrode GE, for example, a molybdenum-tungsten alloy (MoW) is used. The gate electrode GE may be formed to be integrated with the respective scanning line.

The insulating layer ILI is provided to cover the semiconductor layer SC and the gate electrode GE. The insulating layer ILI is formed, for example, in a single layer of silicon oxide or silicon nitride or stacked layers of these.

On the insulating layer ILI, a source electrode SE and a drain electrode DE are provided. The source electrode SE and the drain electrode DE are connected to a source region and a drain region of the semiconductor layer SC, respectively, via respective contact holes made in the insulating layer ILI and the insulating layer GI. The source electrode SE may be formed to be integrated with the respective signal line.

An insulating layer PAS is provided to cover the source electrode SE, the drain electrode DE and the insulating layer ILI. An insulating layer PLL is provided to cover the insulating layer PAS.

The insulating layer PAS is formed from an inorganic insulating material. Examples of the inorganic insulating material are a single layer of silicon oxide or silicon nitride or a multi-stacked layer of these. The insulating layer PLL is formed from an organic insulating material. Examples of the organic insulating material are organic materials such as photosensitive acrylic and polyimide. With the insulating layer PLL thus provided, steps caused by the transistor Tr can be planarized.

The anodes PE (pixel electrodes) are provided on the insulating layer PRL. The anodes PE are connected to the drain electrodes DE via respective contact holes made in the insulating layer PAS and PLL.

The part of the configuration from the anodes PE to the cathode CE (the common electrode) is as described in connection with FIG. 3. An insulating layer SEY is provided to cover the cathode CE. The insulating layer SEY has the function of preventing moisture from entering the light emitting layer EL from the outside, as described above. As described above, a type having a high gas barrier property is suitable for the insulating layer SEY. As the insulating layer SEY, for example, a type of insulating layer, in which an organic insulating layer is sandwiched between two inorganic insulating layers containing nitrogen, can be used. Examples of the material for the organic insulating layer are acrylic resin, epoxy resin, polyimide resin and the like. Examples of the material for the nitrogen-containing inorganic insulating layers are silicon nitride and aluminum nitride.

The base BA2 is provided on the insulating layer SEY. The base BA2 is formed of a material similar to that of the base BA1. Between the base BA2 and the insulating layer SEY, an inorganic insulating layer or an organic insulating layer, which has translucency may be provided. The organic insulating layer may have the function of bonding the insulating layer SEY and the base BA2 together.

A method of manufacturing the display device of this embodiment will now be described. FIGS. 5 to 23 illustrate the method of manufacturing the display device of the embodiment. Note that in FIGS. 5 to 23, only the manufacturing process for the light emitting layer which emits blue (B) light is illustrated.

First, the anode PE is formed on the base BA1. In the cross-sectional view shown in FIG. 5, the anode PEB that opposes the blue (B) emitting layer is provided as the anode PE.

Figure 6:
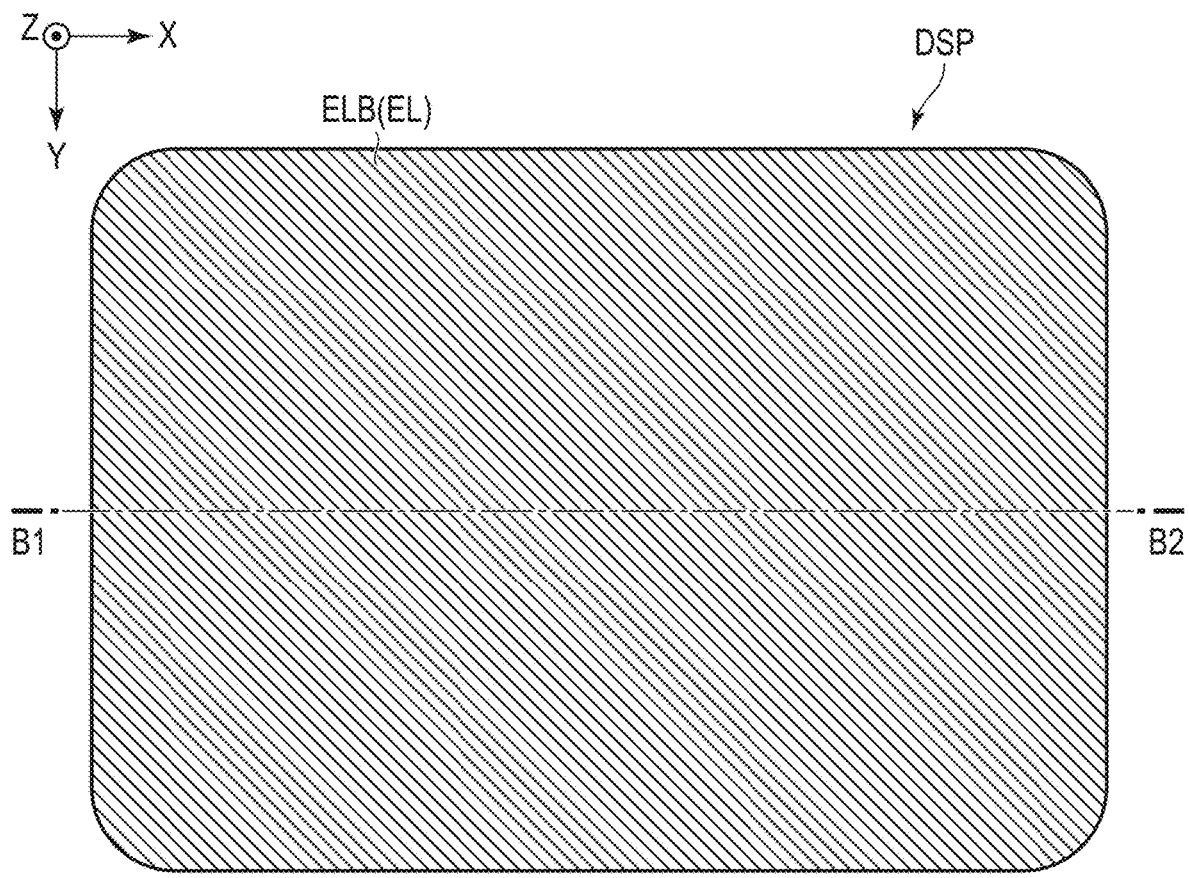
FIG. 6 is a diagram illustrating the method of manufacturing the display device of the embodiment.
Figure 7:
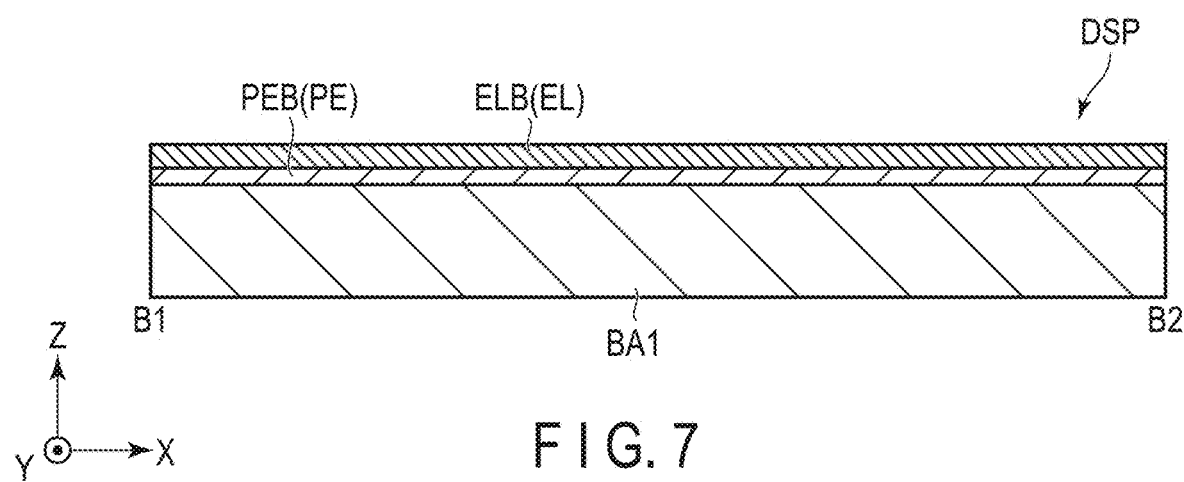
FIG. 7 is a diagram illustrating the method of manufacturing the display device of the embodiment.

On the anode PEB, the light emitting layer ELB that emits blue (B) light is formed. FIG. 6 is a plan view of the display device when the light emitting layer ELB is formed. FIG. 7 is a cross-sectional view of the display device taken along line B1-B2 shown in FIG. 6. The light emitting layer ELB is provided in contact with the entire surface of the anode PEB. The light emitting layer ELB can be formed, for example, by vapor deposition, inkjet, coating, printing, or other method.

This embodiment is described in connection with an example in which the light emitting layer ELB is provided, but the embodiment is not limited to this example. In place stead of the light emitting layer ELB, a light emitting layer ELR that emits red (R) light or a light emitting layer ELG that emits green (G) light may as well be provided. The order of forming the light emitting layer ELB, the light emitting layer ELG and the light emitting layer ELR is not limited to that of this embodiment.

Figure 8:
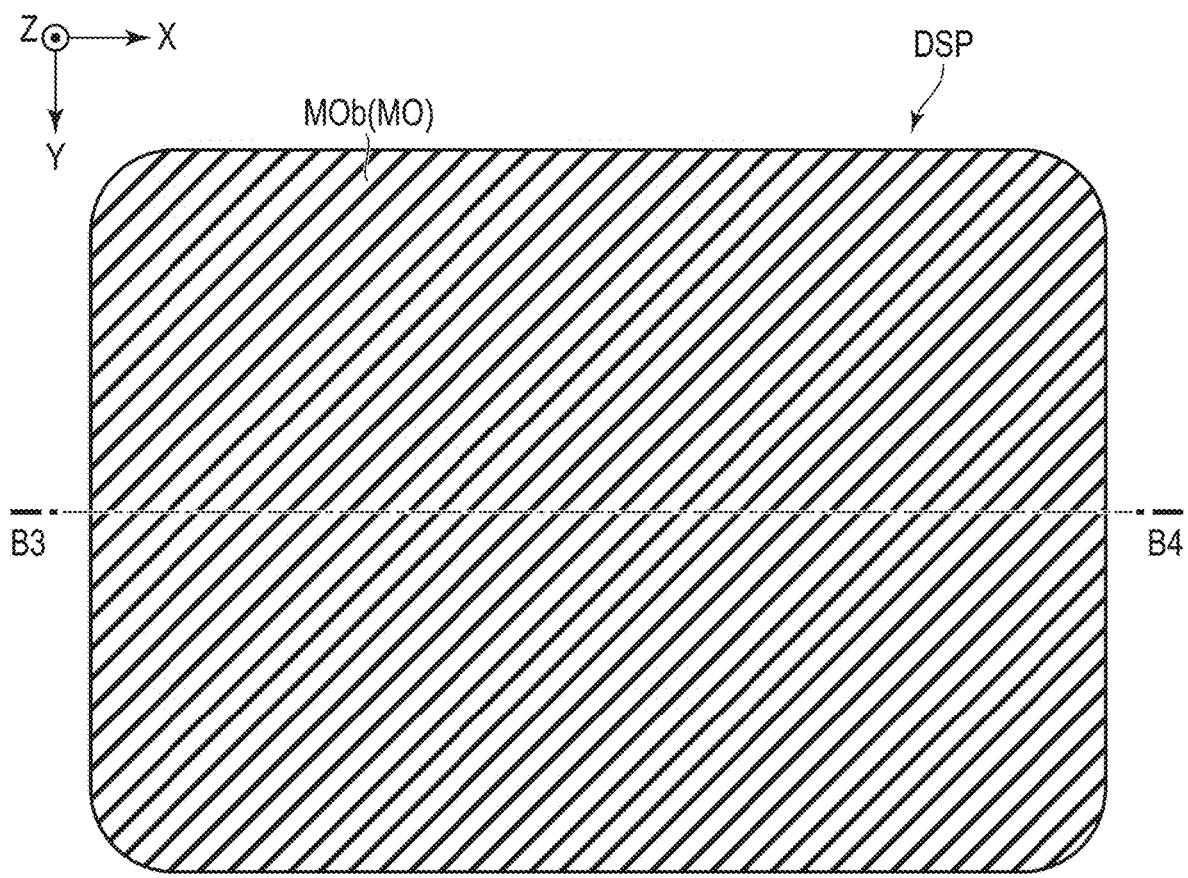
FIG. 8 is a diagram illustrating the method of manufacturing the display device of the embodiment.
Figure 9:
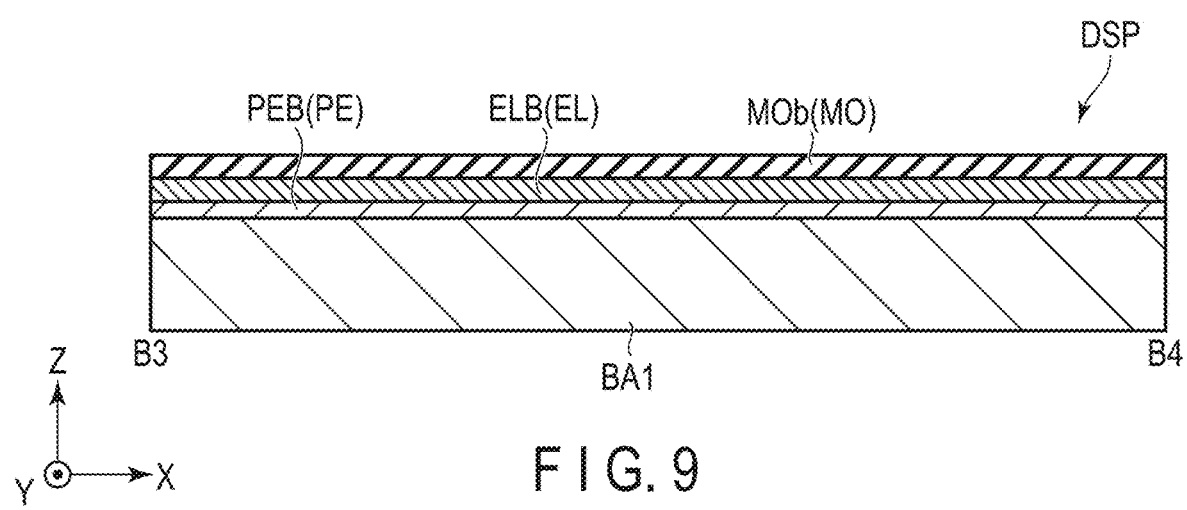
FIG. 9 is a diagram illustrating the method of manufacturing the display device of the embodiment.

The metal oxide layer MOb is formed on the light emitting layer ELB. FIG. 8 is a plan view of the display device when the metal oxide layer MOb is formed. FIG. 9 is a cross-sectional view of the display device taken along line B3-B4 shown in FIG. 8. The metal oxide layer MOb is provided in contact with the entire surface of the light emitting layer ELB.

Figure 10:
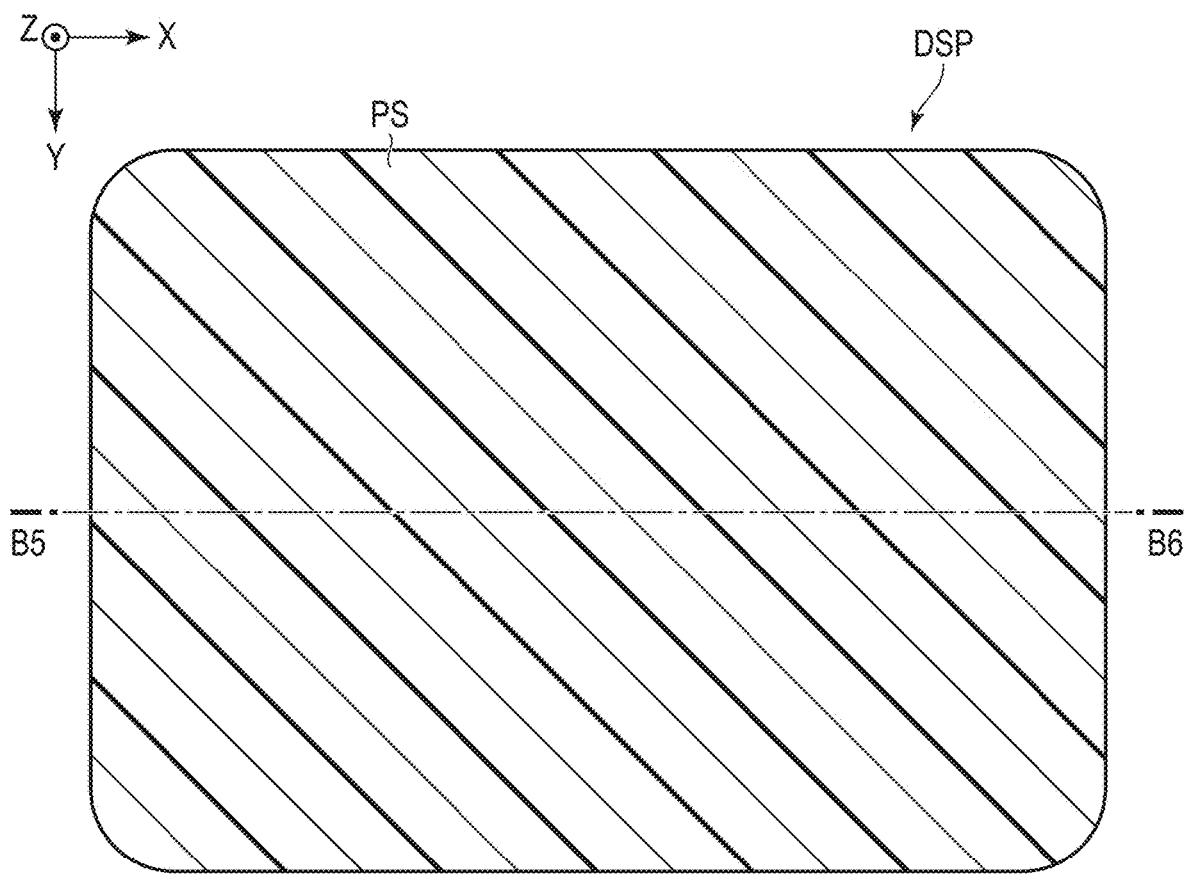
FIG. 10 is a diagram illustrating the method of manufacturing the display device of the embodiment.
Figure 11:
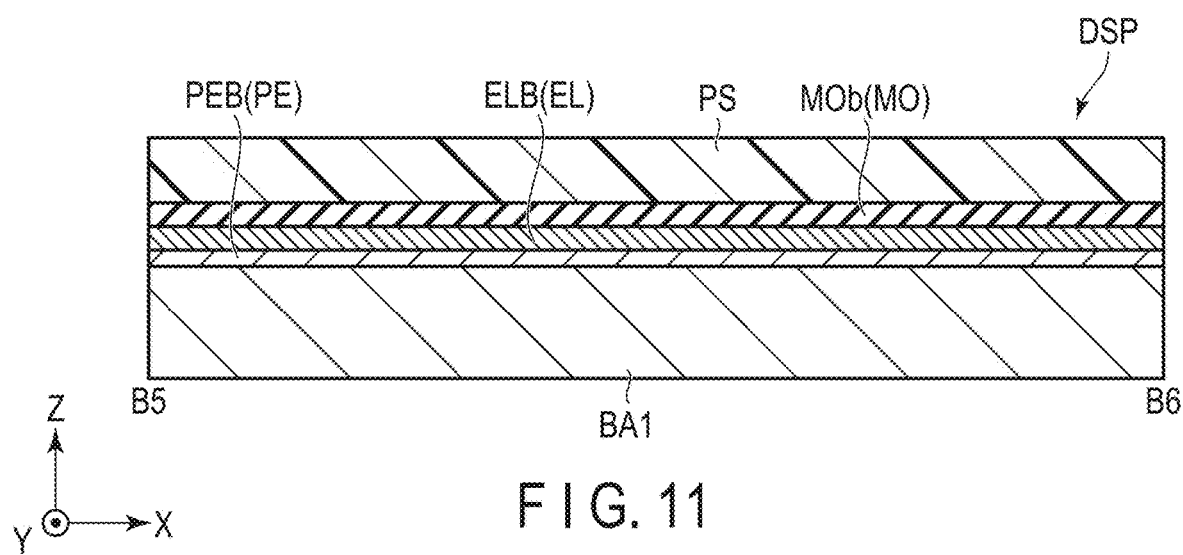
FIG. 11 is a diagram illustrating the method of manufacturing the display device of the embodiment.

A photoresist PS is formed to cover the metal oxide layer MOb. FIG. 10 is a plan view of the display device when the photoresist PS is formed. FIG. 11 is a cross-sectional view of the display device taken along line B5-B6 shown in FIG. 10.

Figure 12:
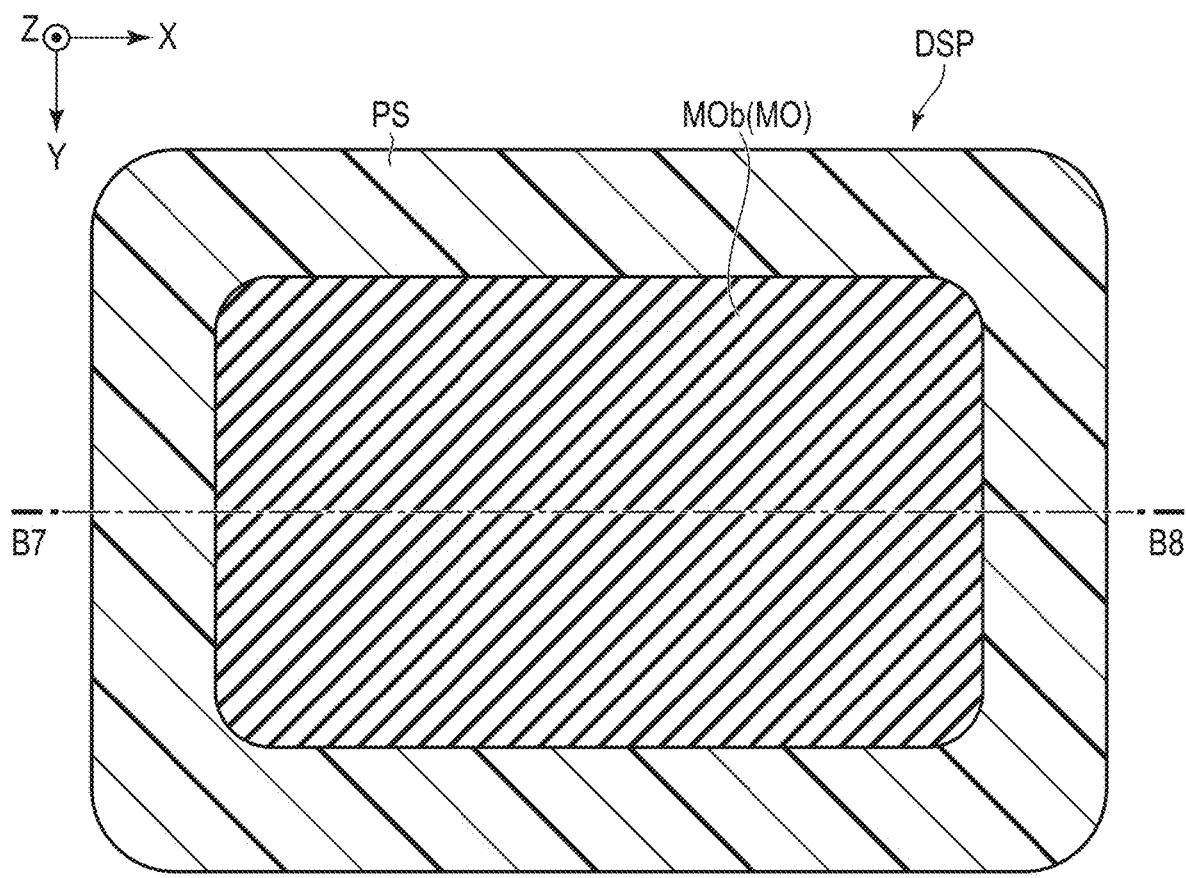
FIG. 12 is a diagram illustrating the method of manufacturing the display device of the embodiment.
Figure 13:
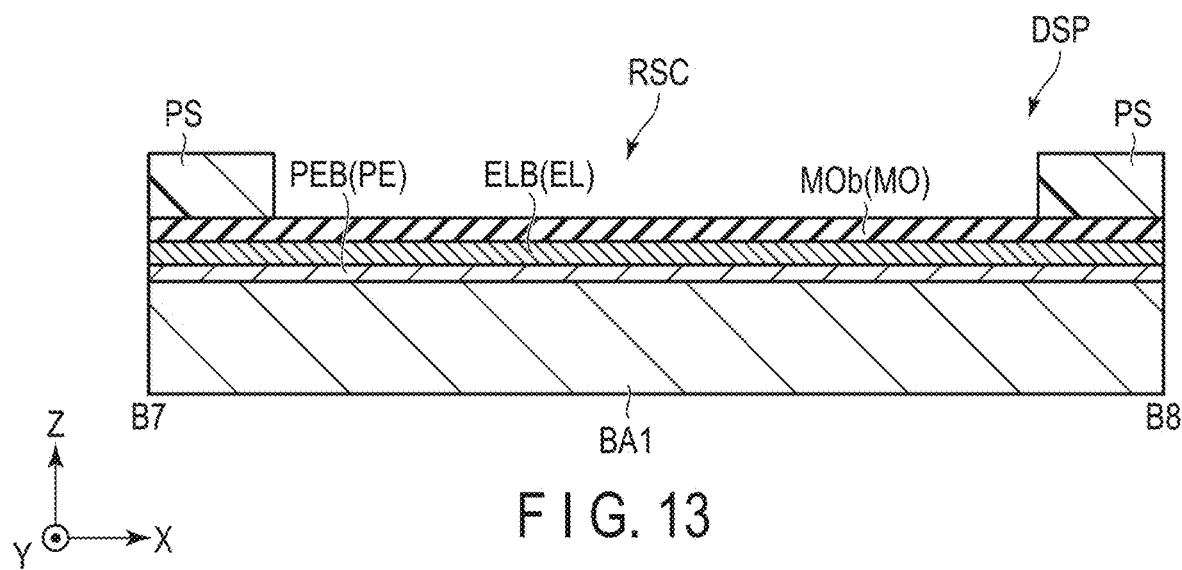
FIG. 13 is a diagram illustrating the method of manufacturing the display device of the embodiment.

A portion of the photoresist PS is removed by the photolithography process. FIG. 12 is a plan view of the display device after the photolithography process is carried out. FIG. 13 is a cross-sectional view of the display device taken along line B7-B8 shown in FIG. 12. By removing the portion of the photoresist PS, the metal oxide layer MOb is exposed. The area of the removed portion of the photoresist PS is referred to as a recessed portion RSC.

Figure 14:
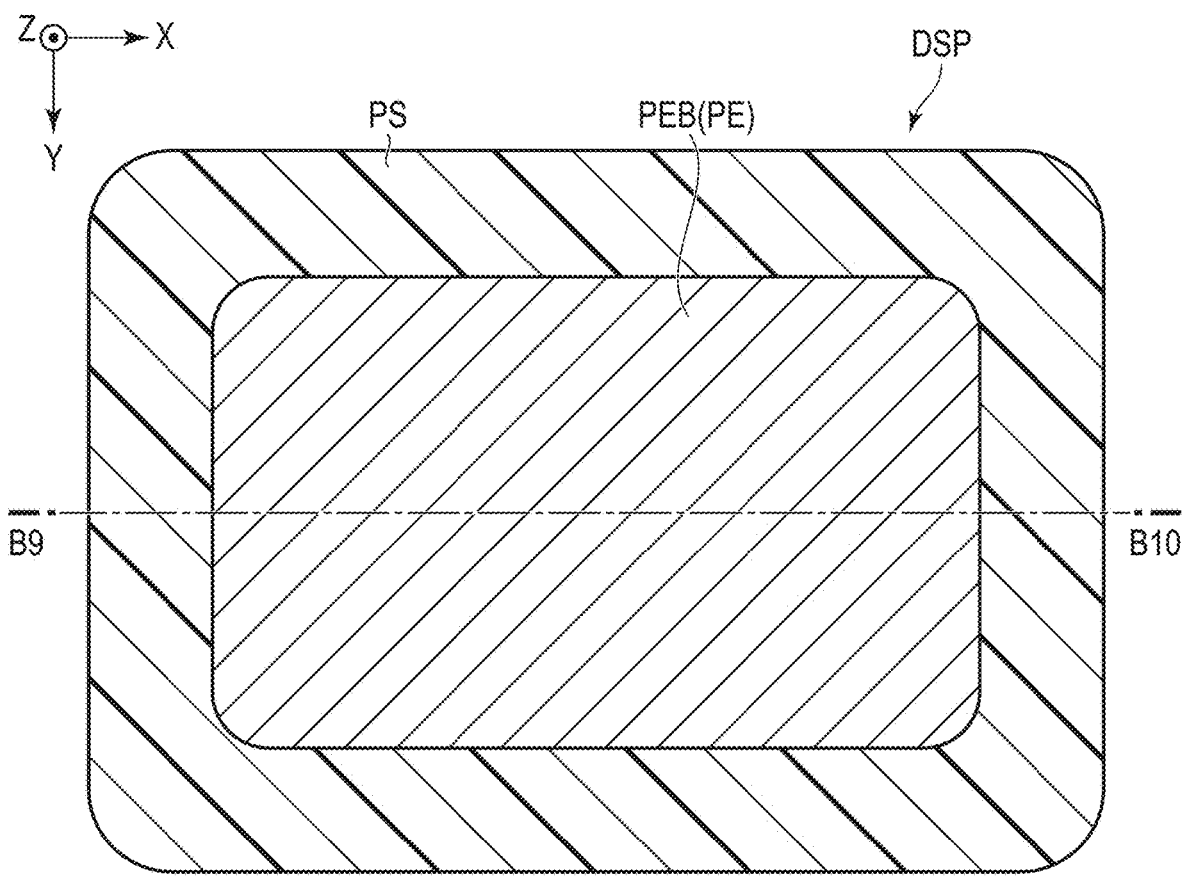
FIG. 14 is a diagram illustrating the method of manufacturing the display device of the embodiment.
Figure 15:
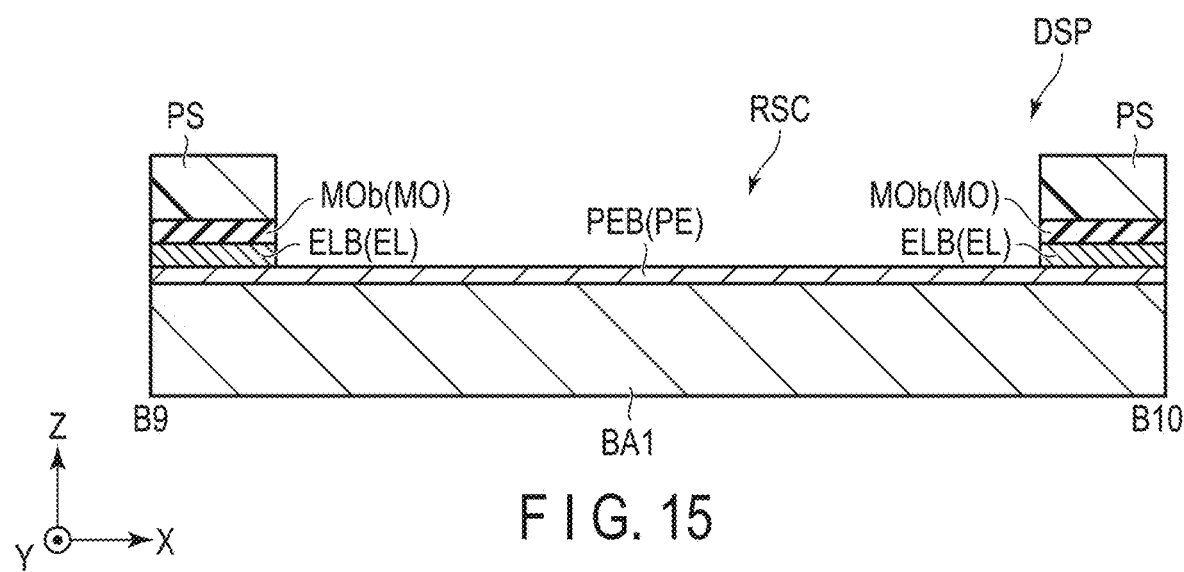
FIG. 15 is a diagram illustrating the method of manufacturing the display device of the embodiment.

Using the remaining photoresist PS as a mask, the metal oxide layer MOb and the light emitting layer ELB are removed. FIG. 14 is a plan view of the display device after the metal oxide layer MOb and the light emitting layer ELB are removed. FIG. 15 is a cross-sectional view of the display device taken along line B9-B10 shown in FIG. 14. In the recessed portion RSC, the anode PEB is exposed.

Figure 16:
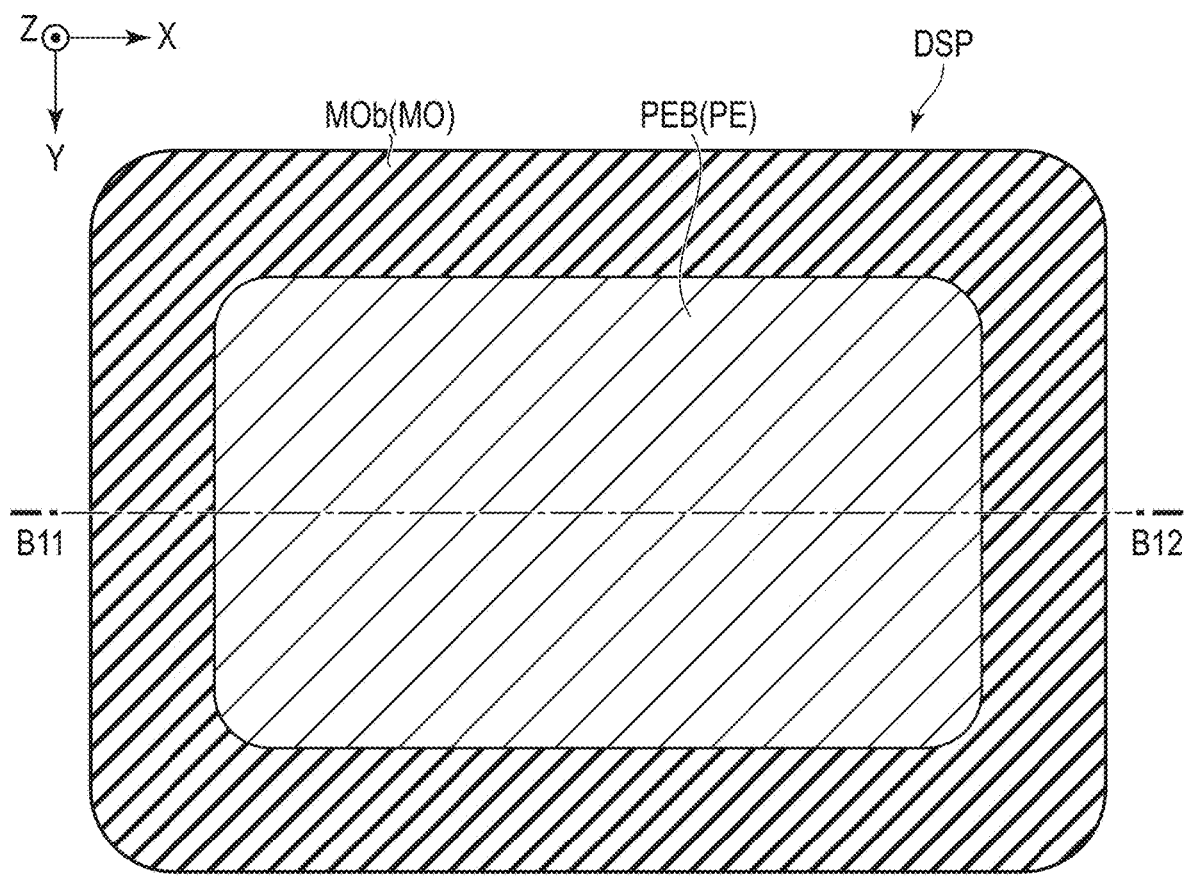
FIG. 16 is a diagram illustrating the method of manufacturing the display device of the embodiment.
Figure 17:
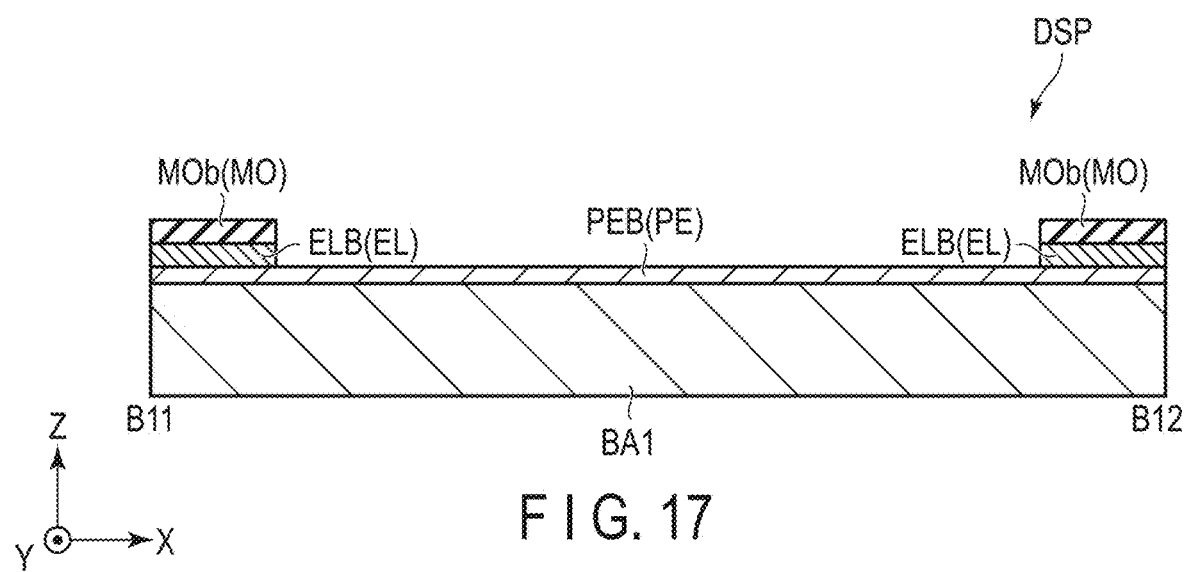
FIG. 17 is a diagram illustrating the method of manufacturing the display device of the embodiment.

Then, the remaining photoresist PS is removed to expose the metal oxide layer MOb. FIG. 16 is a plan view of the display device after the photoresist PS is removed. FIG. 17 is a cross-sectional view of the display device taken along line B11-B12 shown in FIG. 16. In a area of the anode PEB, which is the so-called solid film, a stacked layer body of the light emitting layer ELB and the metal oxide layer MOb is provided. The stacked layer body of the light emitting layer ELB and the metal oxide layer MOb has a ring shape in plan view.

Figure 18:
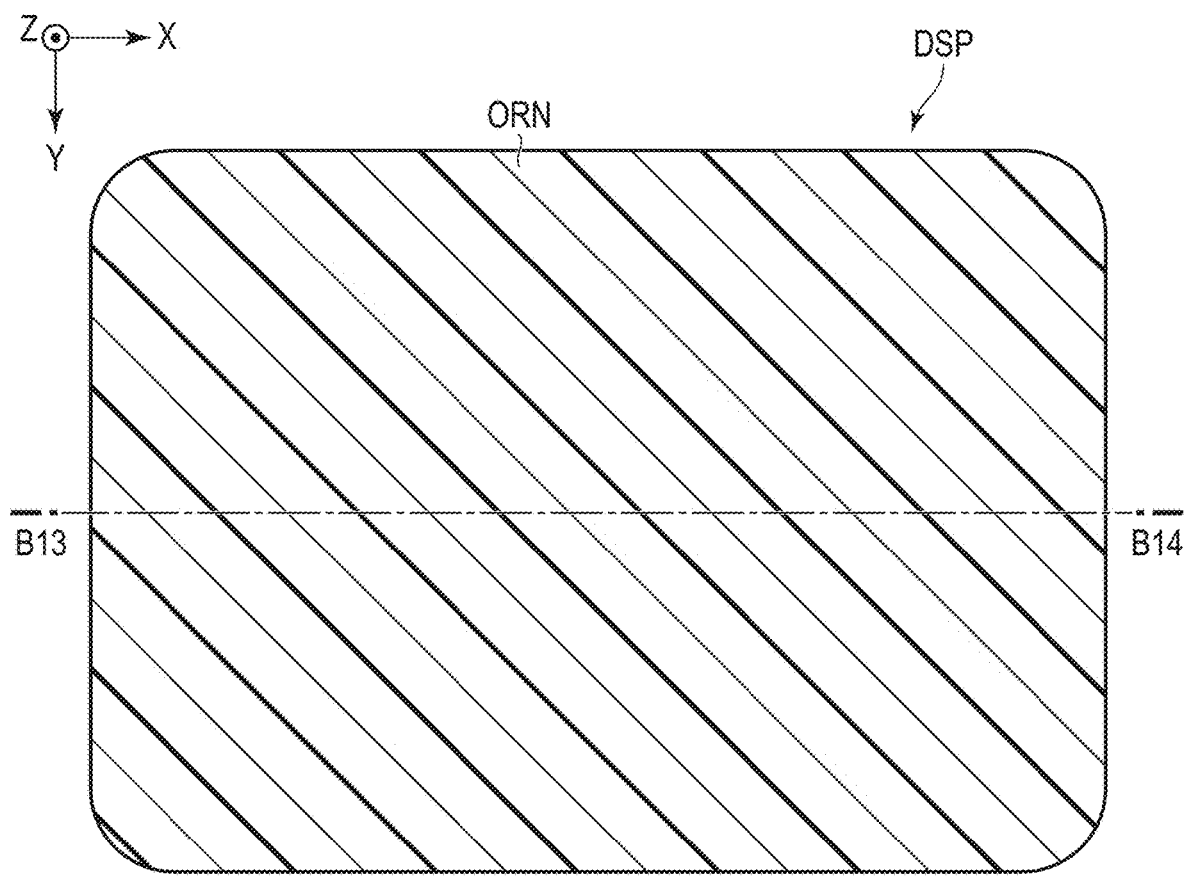
FIG. 18 is a diagram illustrating the method of manufacturing the display device of the embodiment.
Figure 19:
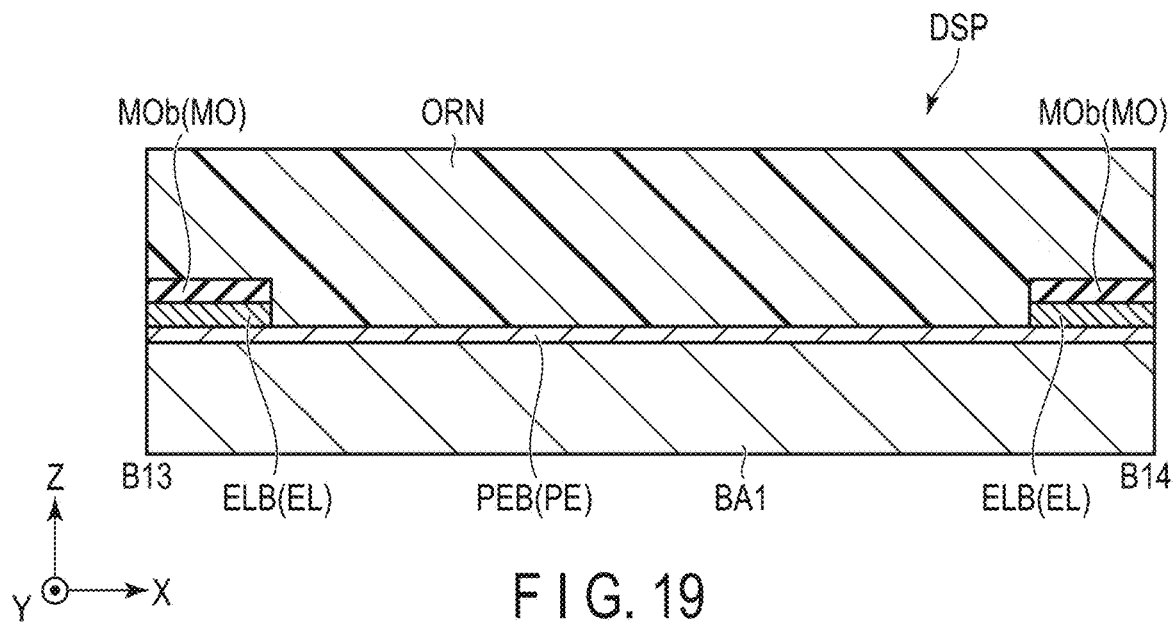
FIG. 19 is a diagram illustrating the method of manufacturing the display device of the embodiment.

An organic insulating film ORN is formed to cover the anode PEB, the light emitting layer ELB and the metal oxide layer MOb. FIG. 18 is a plan view of the display device when the organic insulating film ORN is formed. FIG. 19 is a cross-sectional view of the display device taken along line B13-B14 shown in FIG. 18. As the organic insulating film ORN, the organic insulating material, which is the material for the bank BNK described above, is used.

Figure 20:
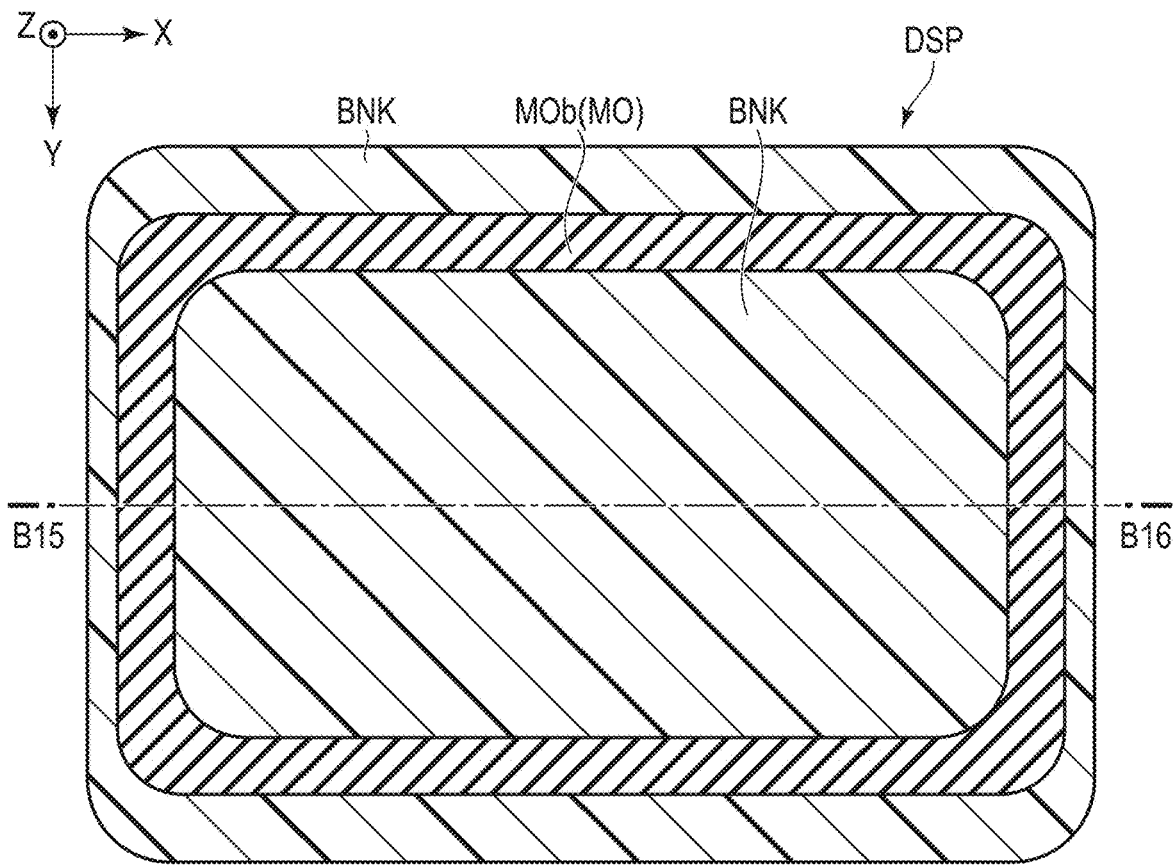
FIG. 20 is a diagram illustrating the method of manufacturing the display device of the embodiment.
Figure 21:
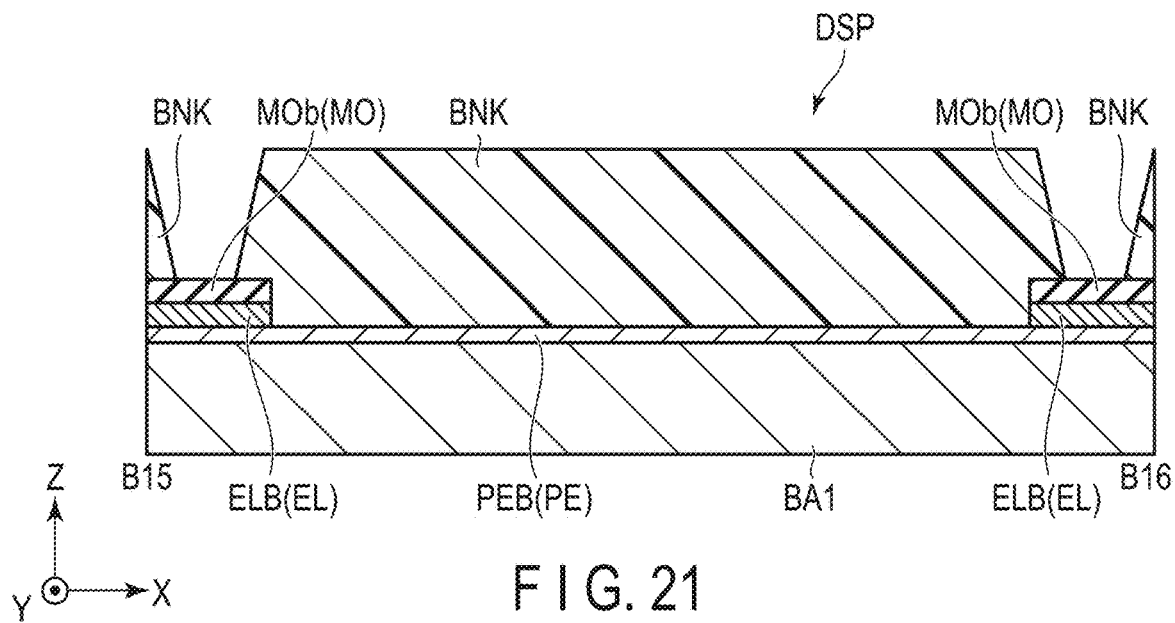
FIG. 21 is a diagram illustrating the method of manufacturing the display device of the embodiment.

The organic insulating film ORN on the metal oxide layer MOb is removed, thus forming the bank BNK. FIG. 20 is a plan view of the display device when a portion of the organic insulating film ORN is removed. FIG. 21 is a cross-sectional view of the display device taken along line B15-B16 shown in FIG. 20. With the removal of the portion of the organic insulating film ORN, a part of the metal oxide layer MOb is exposed.

Figure 22:
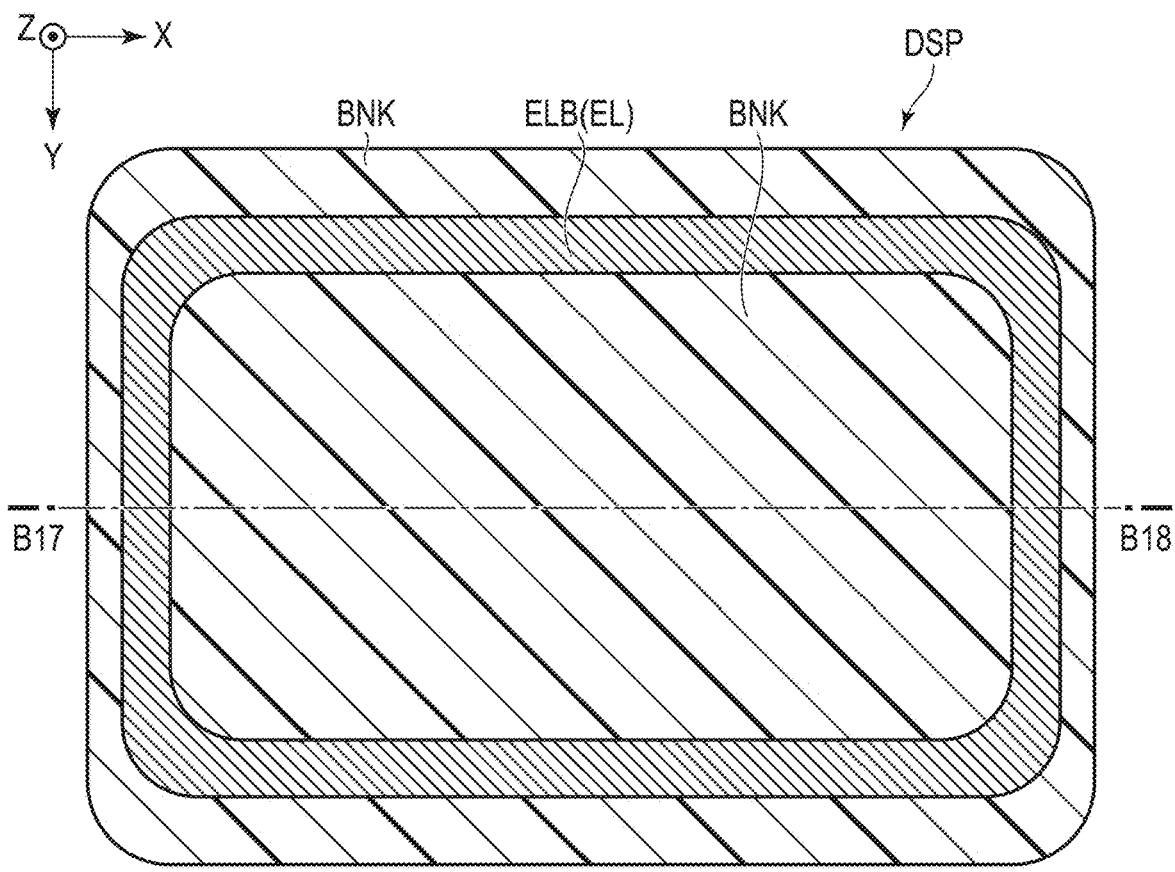
FIG. 22 is a diagram illustrating the method of manufacturing the display device of the embodiment.

The exposed portion of the metal oxide layer MOb is removed, thus forming the opening OPb. FIG. 22 is a plan view of the display device when the portion of the metal oxide layer MOb is removed. FIG. 23 is a cross-sectional view of the display device taken along line B17-B18 shown in FIG. 22. With the removal of the portion of the metal oxide layer MOb, a part of the light emitting layer ELB is exposed at a bottom portion of the opening OPb.

As described above, a stacked layer body of the anode PEB, the light emitting layer ELB and the metal oxide layer MOb that emits blue (B) light is formed. The other colors, that is, for a stacked layer body of the anode PER, the light emitting layer ELR and the metal oxide layer MOr, that emits red (R) light, and a stacked layer body of the anode PEG, the light emitting layer ELG and the metal oxide layer MOg, that emits green (G) light, are formed by repeating the above-described processing steps (see FIGS. 2 to 4).

According to this embodiment, such a display device DSP can be obtained that a light emitting layer emitting a predetermined color is surrounded by light emitting layers emitting colors different from the predetermined color. A metal oxide layer is provided on the light emitting layer in contact with the light emitting layer. With use of the metal oxide layer, it is possible to form light emitting layers that emit different colors, independently. Thus, with this embodiment, it is possible to obtain a display device DSP that enables a wider flexibility of pixel design.

Configuration Example 1

Figure 24:
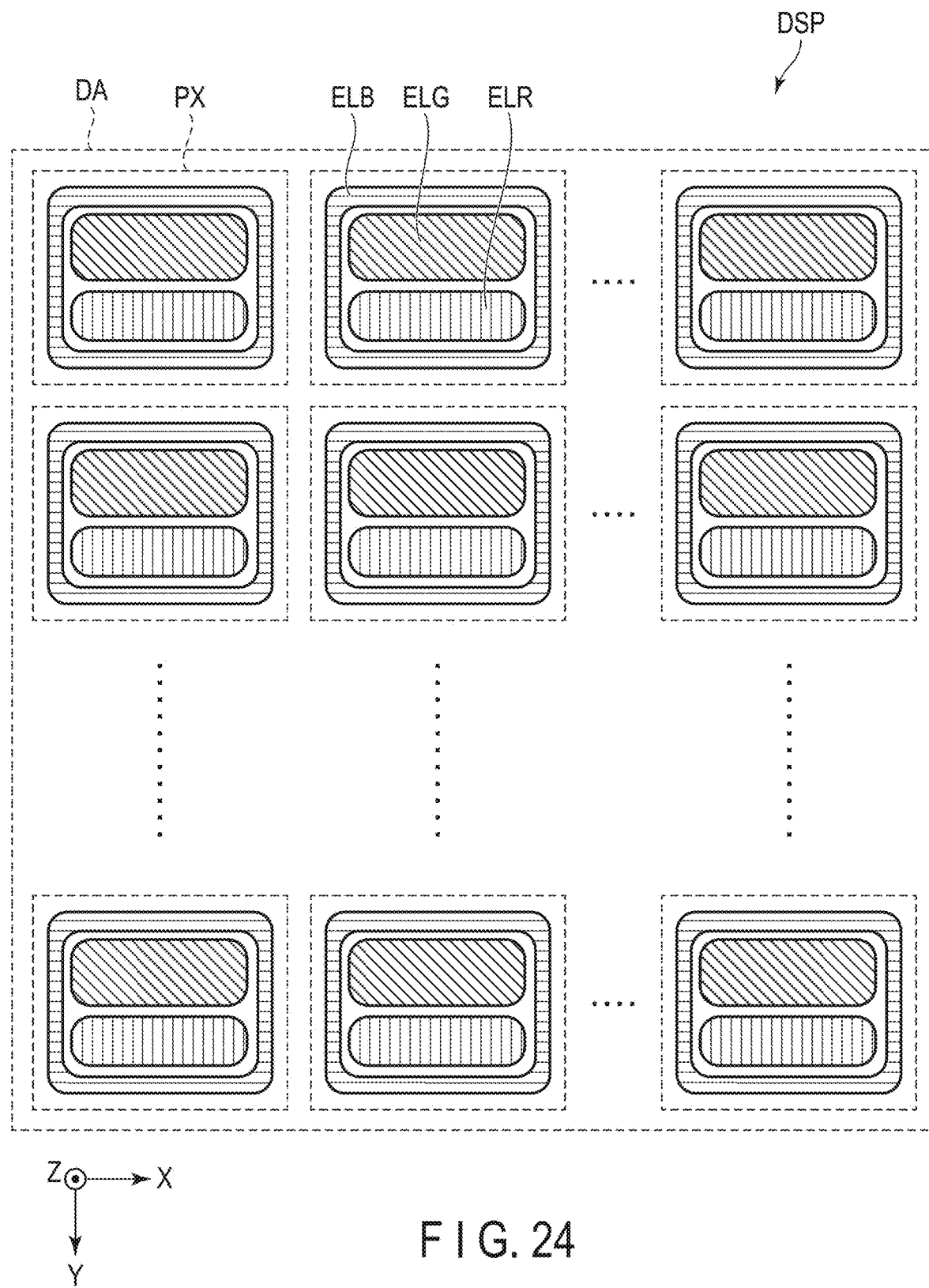
FIG. 24 is a plan view showing another configuration example of the display device in the embodiment.

FIG. 24 is a plan view of another configuration example of the display device in the embodiment. The configuration example shown in FIG. 24 differs from that shown in FIG. 2 in that two light emitting layers provided adjacent to each other are surrounded by still another light emitting layer.

In FIG. 24, the light emitting layers ELG and ELR, which are approximately elliptical or rectangular in shape, are arranged side by side adjacent to each other. The light emitting layer ELG and the light emitting layer ELR extend along the first direction X and arranged side by side along the second direction Y. Note here that the shape of the light emitting layers is not limited to this, but they may extend along the second direction and arranged side by side along the first direction X. The sizes of the light emitting layer ELG and the light emitting layer ELR may be approximately the same as each other, or one may be larger than the other.

A ring-shaped light emitting layer ELB is provided to surrounding the two light emitting layers ELG and ELR. Note that this configuration example is not limited to that shown in FIG. 24. The ring-shaped light emitting layer may be the light emitting layer ELR or the light emitting layer ELG in place of the light emitting layer ELB.

With this configuration example as well, advantageous effects similar to those of the embodiment can be exhibited.

In this specification, the light emitting layer ELR, the light emitting layer ELG and the light emitting layer ELB are referred to as the first light emitting layer, the second light emitting layer and the third light emitting layer, respectively.

The red (R) color, green (G) color and blue (B) color are referred to as the first color, second color, and third color, respectively.

The metal oxide layer MOr, the metal oxide layer MOg and the metal oxide layer MOb are referred to as the first metal oxide layer, the second metal oxide layer and the third metal oxide layer, respectively. The metal oxide layer IMO1 and the metal oxide layer IMO2 are referred to as the first metal oxide layer and the second metal oxide layer, respectively.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first light emitting layer provided in center in plan view;
a first metal oxide layer provided on the first light emitting layer;
a ring-shaped second light emitting layer provided to surround the first light emitting layer;
a second metal oxide layer provided on the second light emitting layer;
a ring-shaped third light emitting layer provided to surround the second light emitting layer;
a third metal oxide layer provided on the third light emitting layer;
an organic insulating layer which covers the first emitting layer, the second emitting layer, the third emitting layer, the first metal oxide layer, the second metal oxide layer, and the third metal oxide layer;
a first opening formed in the first metal oxide layer and the organic insulating layer, to reach the first light emitting layer;
a second opening formed in the second metal oxide layer and the organic insulating layer, to reach the second light emitting layer; and
a third opening formed in the third metal oxide layer and the organic insulating layer, to reach the third light emitting layer.

2. The display device according to claim 1, further comprising:
a first anode provided in contact with the first light emitting layer;
a second anode provided in contact with the second light emitting layer;
a third anode provided in contact with the third light emitting layer; and
a cathode provided inside each of the first opening, the second opening and the third opening and covering the organic insulating layer.

3. The display device according to claim 1, further comprising:
a first interlayer metal oxide layer provided between the first metal oxide layer and the second light emitting layer; and
a second interlayer metal oxide layer provided between the second metal oxide layer and the third light emitting layer.

4. The display device according to claim 1, wherein
the first light emitting layer emits light of a first color;
the second light emitting layer emits light of a second color; and
the third light emitting layer emits light of a third color.

5. The display device according to claim 4, wherein
the first color, the second color and the third color are red, green and blue, respectively.

6. A display device comprising:
a first light emitting layer and a second light emitting layer provided adjacent to each other in plan view;
a first metal oxide layer provided on the first light emitting layer;
a second metal oxide layer provided on the second light emitting layer;
a ring-shaped third light emitting layer provided to surround the first light emitting layer and the second light emitting layer;
a third metal oxide layer provided on the third light emitting layer;
an organic insulating layer which covers the first light emitting layer, the second light emitting layer, the third light emitting layer, the first metal oxide layer, the second metal oxide layer and the third metal oxide layer;
a first opening formed in the first metal oxide layer and the organic insulating layer, to reach the first light emitting layer;
a second opening formed in the second metal oxide layer and the organic insulating layer, to reach the second light emitting layer; and
a third opening formed in the third metal oxide layer and the organic insulating layer, to reach the third light emitting layer.

7. The display device according to claim 6, further comprising:
a first anode provided in contact with the first light emitting layer;
a second anode provided in contact with the second light emitting layer;
a third anode provided in contact with the third light emitting layer;
a cathode provided inside each of the first opening, the second opening and the third opening, and covering the organic insulating layer.

8. The display device according to claim 6, further comprising:
a first interlayer metal oxide layer provided between the first metal oxide layer and the second light emitting layer; and
a second interlayer metal oxide layer provided between the second metal oxide layer and the third light emitting layer.

9. The display device according to claim 6, wherein
the first light emitting layer emits light of a first color,
the second light emitting layer emits light of a second color, and
the third light emitting layer emits light of a third color.

10. The display device according to claim 9, wherein
the first color, the second color and the third color are red, green and blue, respectively.

* * * * *